(12) United States Patent
Li et al.

(10) Patent No.: US 9,570,611 B2
(45) Date of Patent: Feb. 14, 2017

(54) METHOD AND DEVICE FOR HIGH K METAL GATE TRANSISTORS

(71) Applicant: SEMICONDUCTOR MANUFACTURING INTERNATIONAL (SHANGHAI) CORPORATION, Shanghai (CN)

(72) Inventors: Yong Li, Shanghai (CN); Xiao Na Wang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 15/002,020

(22) Filed: Jan. 20, 2016

(65) Prior Publication Data

US 2016/0225903 A1    Aug. 4, 2016

(30) Foreign Application Priority Data

Feb. 4, 2015    (CN) .......................... 2015 1 0058467

(51) Int. Cl.

| | |
|---|---|
| *H01L 21/02* | (2006.01) |
| *H01L 29/78* | (2006.01) |
| *H01L 21/8238* | (2006.01) |
| *H01L 27/092* | (2006.01) |
| *H01L 29/06* | (2006.01) |
| *H01L 29/08* | (2006.01) |
| *H01L 29/49* | (2006.01) |
| *H01L 29/66* | (2006.01) |
| *H01L 29/161* | (2006.01) |
| *H01L 29/16* | (2006.01) |
| *H01L 29/165* | (2006.01) |

(52) U.S. Cl.
CPC ... *H01L 29/7848* (2013.01); *H01L 21/823814* (2013.01); *H01L 21/823842* (2013.01); *H01L 21/823878* (2013.01); *H01L 27/0922* (2013.01); *H01L 29/0653* (2013.01); *H01L 29/0847* (2013.01); *H01L 29/161* (2013.01); *H01L 29/165* (2013.01); *H01L 29/1608* (2013.01); *H01L 29/4966* (2013.01); *H01L 29/66492* (2013.01); *H01L 29/66545* (2013.01)

(58) Field of Classification Search
CPC ............. H01L 29/4966; H01L 29/7851; H01L 29/517; H01L 29/66795; H01L 29/6656; H01L 29/513; H01L 21/02164; H01L 21/0217; H01L 21/28088
USPC .......................................... 257/410; 438/595
See application file for complete search history.

(56) References Cited

U.S. PATENT DOCUMENTS

| | | | |
|---|---|---|---|
| 2011/0284966 A1* | 11/2011 | Wen ................ | H01L 21/823456 257/368 |
| 2013/0102145 A1* | 4/2013 | Huang .............. | H01L 21/32139 438/595 |
| 2016/0049491 A1* | 2/2016 | Lin ..................... | H01L 29/4966 257/410 |

* cited by examiner

*Primary Examiner* — Trung Q Dang
(74) *Attorney, Agent, or Firm* — Kilpatrick Townsend and Stockton LLP (57) ABSTRACT

A method of manufacturing a semiconductor device includes providing a semiconductor substrate. The semiconductor substrate includes a dummy gate structure formed thereon and an offset spacer formed on a sidewall of the dummy gate structure. The method further includes removing the dummy gate structure to form a gate trench, forming a high-k dielectric layer on the bottom and the sidewall of the gate trench, and forming a cover layer over the high-k dielectric layer. The cover layer has a thickness that is greater at the corners of the bottom of the gate trench than in the middle region of the bottom of the gate trench.

18 Claims, 6 Drawing Sheets

"Bow"-shaped TiAl

METHOD AND DEVICE FOR HIGH K METAL GATE TRANSISTORS

CROSS-REFERENCES TO RELATED APPLICATIONS

This application claims priority to Chinese patent application No. 201510058467.6, filed on Feb. 4, 2015, the content of which is incorporated herein by reference in its entirety.

BACKGROUND OF THE INVENTION

The present invention relates to semiconductor technologies, and more particularly to a method of manufacturing a semiconductor device.

In the next generation manufacturing processes of integrated circuits, high-k (HK) dielectrics are usually used in the fabrication of gate structures in metal-oxide-semiconductor (MOS) devices. Whether in a HK-first or a HK-last scheme, aluminum diffusion is always a problem affecting a device's reliability and performance parameters, such as time dependent dielectric breakdown (TDDB), negative bias temperature instability (NBTI), positive bias temperature instability (PBTI), and the like. Aluminum diffusion may also degrade carrier mobility, which in turn affects a device's performance.

Figure 1:
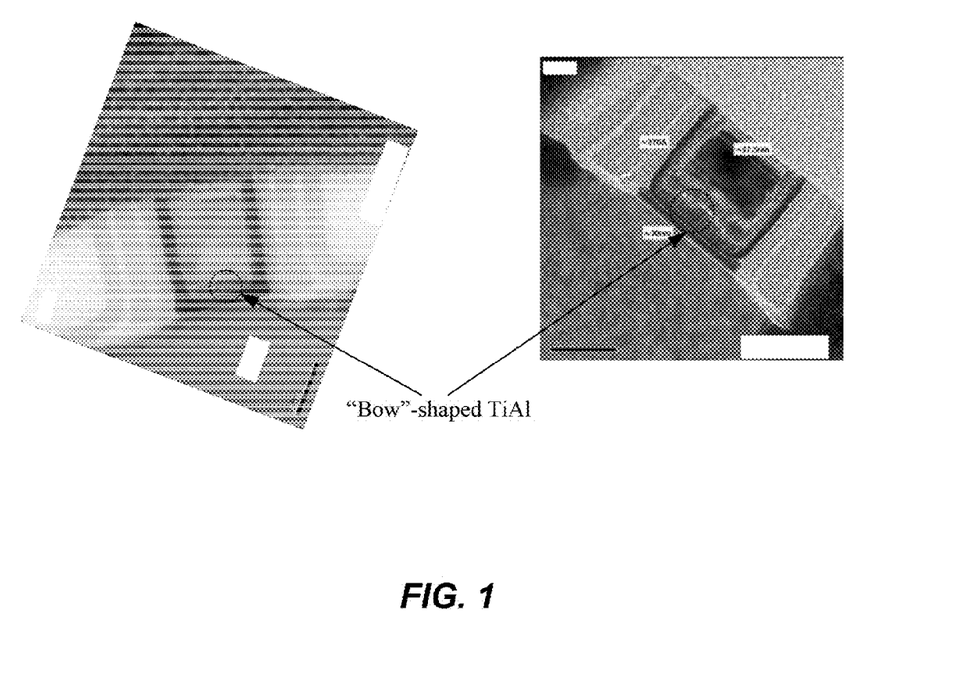
FIG. 1 illustrates a scanning electron microscope (SEM) cross-sectional image of a TiAl layer deposited in a gate trench, in (A) a HK-last, and (B) a HK-first scheme, according to a conventional method.

The inventors have observed that there are two paths for aluminum diffusion. One of them is through the middle region of a gate trench; and the other is through the sidewall of a gate trench. Currently, the negative work function (NWF) metal layer is formed by physical vapor deposition (PVD) of TiAl. Such NWF layer has a strong tensile stress. After deposition and the following thermal treatment, the NWF metal layer at the bottom of the gate trench has a "bow" shape. That is, the TiAl layer is thicker in the middle of the bottom of the gate trench than near the sidewall of the gate trench, as illustrated in FIG. 1. As a result, aluminum is more likely to diffuse downward through the sidewall than through the middle region of the bottom of the gate trench.

Therefore, there is a need for a better manufacturing method.

SUMMARY OF THE INVENTION

In embodiments of the present invention, a method of manufacturing a semiconductor device includes providing a semiconductor substrate having a dummy gate structure thereon and an offset spacer on a sidewall of the dummy gate structure. The method includes removing the dummy gate structure to form a gate trench, and forming a high-k dielectric layer on the bottom of the gate trench. The method further includes forming a cover layer over the high-k dielectric layer. The cover layer is relatively thick at the bottom corners of the gate trench, which inhibits the diffusion of aluminum in the metal gate electrode, thereby achieving higher reliability and performance of the device.

According to some embodiments of the present invention, a method of manufacturing a semiconductor device includes providing a semiconductor substrate. The semiconductor substrate includes a dummy gate structure formed thereon and an offset spacer on a sidewall of the dummy gate structure. The method includes removing the dummy gate structure to form a gate trench, and forming a high-k dielectric layer on the bottom of the gate trench. The method further includes forming a cover layer over the high-k dielectric layer. The cover layer has a thickness that is greater at the corners of the bottom of the gate trench than in a middle region of the bottom of the gate trench.

According to an embodiment, the thickness of the cover layer is greater at the corners of the bottom of the gate trench than in the middle region of the bottom of the gate trench by about 3 angstroms to about 30 angstroms.

According to an embodiment, the cover layer is formed by forming the cover layer on the high-k dielectric layer, and sputtering the cover layer by magnetron sputtering, thereby causing the cover layer to have a thickness that is greater at the corners of the bottom of the gate trench than in the middle region of the bottom of the gate trench. According to an embodiment, the magnetron sputtering uses soft argon gas as a sputtering gas.

According to an embodiment, the cover layer is formed by atomic layer deposition (ALD), and includes TiN.

According to an embodiment, the method further includes removing the cover layer on the sidewall of gate trench by back etching.

According to an embodiment, the method further includes, before removing the cover layer on the sidewall of the gate trench, forming a sacrificial material layer on the cover layer. The sacrificial material layer includes a deep ultraviolet light absorbing oxide (DUO) layer. The DUO layer is formed by forming the DUO layer and back etching the DUO layer. According to an embodiment, the DUO layer has a thickness ranging from about 3 nm to about 10 nm.

According to an embodiment, the method further includes, before removing the dummy gate structure, forming a source region and a drain region on each side of the dummy gate structure, respectively, in the semiconductor substrate by lightly doped ion implantation. The method further includes forming a pocket area in each of the source region and the drain region by pocket implantation (PKT), and forming a stress layer in each of the source region and the drain region. The method further includes forming an interlayer dielectric layer on the semiconductor substrate covering the dummy gate structure and the offset spacer, and performing chemical mechanical polishing (CMP) on the interlayer dielectric layer to expose a top portion of the dummy gate structure.

According to an embodiment, the method further includes, after forming the cover layer, forming a barrier layer on the cover layer, forming a work function metal layer on the barrier layer, and forming a metal gate electrode by filling the gate trench.

According to an embodiment, the method further includes, before forming the high-k dielectric layer, forming an interface layer (IL) at the bottom of the gate trench.

According to some embodiments, a semiconductor device includes a semiconductor substrate, an interlayer dielectric layer formed on the semiconductor substrate, a gate trench formed in the interlayer dielectric layer, an offset spacer on an outer sidewall of the gate trench abutting the interlayer dielectric layer, a drain region and a source region on each side of the gate trench, respectively, in the substrate. Each of the drain region and the source region includes a stress layer. The semiconductor device further includes a high-k dielectric layer formed on the bottom and the inner sidewall of the gate trench, and a cover layer formed on the high-k dielectric layer. The cover layer has a thickness that is greater at the corners of the bottom of the gate trench than in the middle region of the bottom of the gate trench.

According to some embodiments, an electronic apparatus includes a semiconductor device and an electronic assembly coupled to the semiconductor device. The semiconductor device includes a semiconductor substrate, an interlayer dielectric layer formed on the semiconductor substrate, a gate trench formed in the interlayer dielectric layer, an offset spacer formed on an outer sidewall of the gate trench abutting the interlayer dielectric layer, a drain region and a source region on each side of the gate trench, respectively, in the substrate. Each of the drain region and the source region includes a stress layer. The semiconductor device further includes a high-k dielectric layer formed on the bottom and the inner sidewall of the gate trench, and a cover layer formed over the high-k dielectric layer. The cover layer has a thickness that is greater at the corners of the bottom of the gate trench than in the middle region of the bottom of the gate trench.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein, but are to include deviations in shapes that result, for example, from manufacturing.

It will be understood that, when an element or layer is referred to as "on," "disposed. on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not he limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. it will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein, but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The present invention will now be described more fully herein after with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

First Embodiment

FIGS. 2A-2E illustrate schematic cross-sectional views of a device in various steps of a manufacturing method according to embodiments of the invention.

Figure 2A:
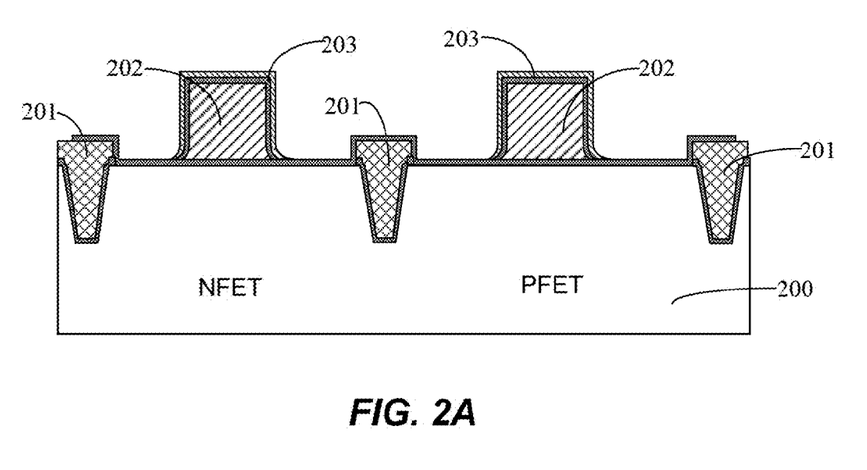
FIGS. 2A-2E illustrate schematic cross-sectional views of a device in various steps of a manufacturing method according to embodiments of the invention.

As shown in FIG. 2A, a semiconductor substrate 200 is provided. The semiconductor substrate 200 may include single crystalline silicon, single crystalline silicon with impurities, silicon on insulator (SOI), stacked silicon on insulator (SSOI), stacked SiGe on insulator (S-SiGeOI), SiGe on insulator (SiGeOI), and the like.

Isolation structures 201 are formed in the semiconductor substrate 200. The isolation structures 201 may be shallow trench isolation (STI), LOCal Oxidation of Silicon (LOCOS), and the like. According to an embodiment, the isolation structures 201 include STI. The isolation structures 201 divide the semiconductor substrate 200 into n-type field transistor (NFET) and p-type field transistor (PFET) regions. The semiconductor substrate 200 also includes various wells, which are not shown for simplicity.

Dummy gate structures 202 are formed on the semiconductor substrate 200. According to an embodiment, each dummy gate structure 202 has a gate foot. Each dummy gate structure 202 includes a sacrificial gate dielectric layer and a sacrificial gate layer. The sacrificial gate dielectric layer includes an oxide, such as silicon dioxide. The sacrificial gate layer includes polycrystalline silicon or amorphous carbon. The sacrificial gate dielectric layer and the sacrificial gate layer may be formed by chemical vapor deposition (CVD) techniques, such as low temperature CVD (LTCVD), low pressure CVD (LPCVD), rapid thermal CVD (RTCVD), plasma-enhanced CVD (PECVD), and the like.

According to an embodiment, the method of forming the dummy gate structures 202 includes: forming a sacrificial gate dielectric layer on the semiconductor substrate 200, forming a sacrificial gate layer on the sacrificial gate dielectric layer, and forming a patterned photoresist layer on the sacrificial gate layer. The pattern of the photoresist layer determines the shape of the dummy gate structure and its critical dimensions. The dummy gate structures 202 are formed by etching away a portion of the sacrificial gate dielectric layer and a portion of the sacrificial gate layer using the photoresist layer as a protective film. The photoresist layer is then removed. It should be appreciated that the method of forming dummy gate structures described above is for illustrative purposes only. One of ordinary skill in the art would recognize many variations, alternatives, and modifications.

Offset spacers 203 are formed on the sidewalls of the dummy gate structures 202. The offset spacers 203 may include silicon nitride, silicon oxide, silicon oxynitride, or other insulating material. According to an embodiment, the offset spacers 203 include oxide and nitride layers. The offset spacers 203 may be formed by methods known in the art, such as CVD. It is inevitable that spacer layers will be formed on top of the dummy gate structures 202 in the process of forming the offset spacers 203. Those spacer layers may be subsequently removed by chemical mechanical polishing (CMP) or etching.

Figure 2B:
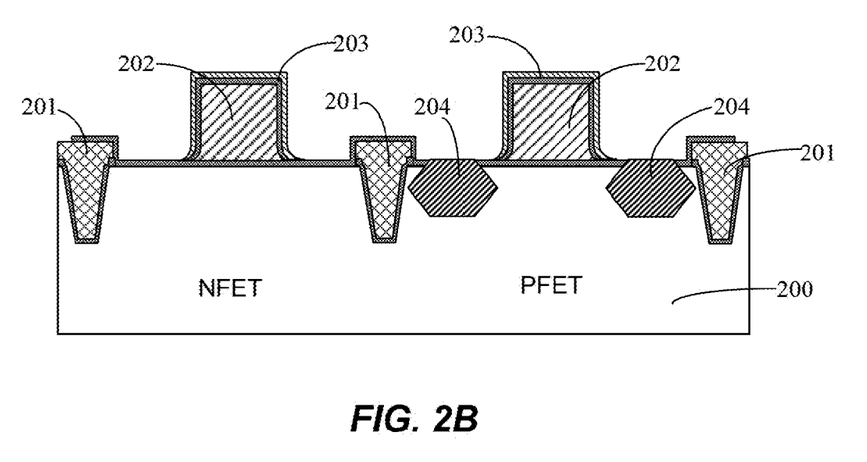

FIG. 2B shows the formation of source/drain stress layers 204.

Before forming the source/drain stress layers 204, a lightly doped source/drain region (not shown in FIG. 2B) may be formed in the semiconductor substrate 200 by using a lightly doped drain (LDD) technique. The LDD technique may be performed by implantation or diffusion methods. The type of ions for LDD implantation depends on the polarity of the semiconductor device. For an NMOS device, the impurity ions may be phosphorus, arsenic, antimony, bismuth, or a combination thereof. For a PMOS device, the impurity ions may be boron. Depending on the desired impurity concentration, the implantation process may be a single-step or a multi-step process.

Then pocket areas are formed at both sides of each dummy gate structure 202 by pocket implantation (PKT) in order to prevent short-channel effect. The elements for the pocket implantation may be, for example, p-type dopants such as boron fluoride or boron, and n-type dopants such as phosphorus or arsenic. The type of dopants used in the pocket implantation depends on the polarity of the semiconductor device.

To activate dopants and to suppress depth-wise and lateral-wise dopant diffusion, spike anneal is performed after pocket implantation. The spike anneal temperature may be between 1000° C. to 1050° C.

Then the source/drain stress layers 204 are formed at both sides of each dummy gate structure 202. For a complementary metal-oxide semiconductor (CMOS) transistors, usually a tensile stress layer is formed in a NMOS transistor, and a compression stress layer is formed in a PMOS transistor, in order to enhance the performance of the CMOS transistor. According to some embodiments, SiC is used for a tensile stress layer, and SiGe is used for a compression stress layer.

Advantageously, a SiC stress layer may be epitaxial grown on the substrate, forming elevated source/drain after ion implantation. A SiGe stress layer may be formed by forming a groove in the substrate, and then forming a SiGe stress layer in the groove by deposition. According to an embodiment, a Σ-shaped groove is formed.

According to an embodiment, dry etching is used to form grooves in the source/drain region. Gases such as $CF_4$ and $CHF_3$, plus one of $N_2$, $CO_2$, or $O_2$ as an ambient gas, may be used for the dry etching. The flow rate for $CF_4$ may be 10-200 sccm. The flow rate for $CF_3$ may be 10-200 sccm. The flow rate for $CO_2$ and $O_2$ may be 10-400 sccm. The pressure for the dry etching may be 30-150 mTorr. The time duration may be 5-120 seconds, preferably 5-60 seconds, more preferably 5-30 seconds. Epitaxial growth of SiGe layer in the grooves is performed by using reduced pressure epitaxy, low temperature epitaxy, selective epitaxy, liquid phase epitaxy, heteroepitaxy, or molecular beam epitaxy.

Figure 2C:
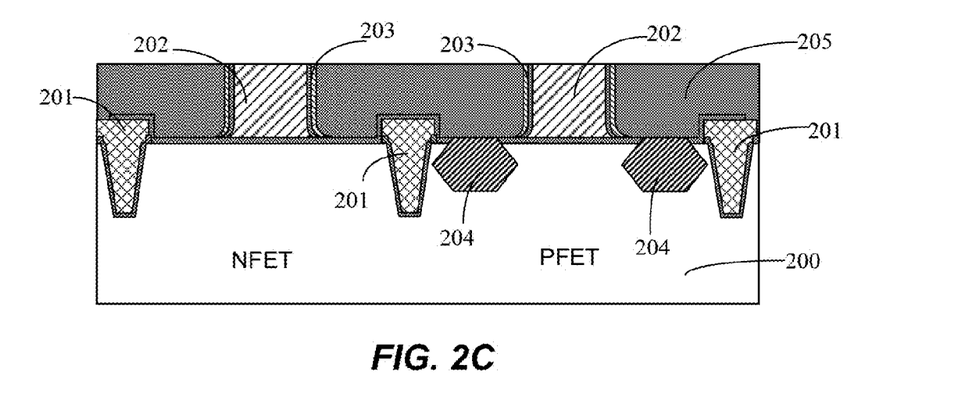

Referring to FIG. 2C, an interlayer dielectric layer 205 is formed covering the dummy gate structures 202 and the offset spacers 203. CMP is performed to expose the top of the dummy gate structures 202.

The interlayer dielectric layer 205 may be formed by using methods known in the art, such as CVD. The interlayer dielectric layer 205 may include, for example, silicon oxide, including doped and undoped silicon oxide films formed by thermal CVD or high density plasma (HDP) methods, such as undoped silica glass (USG), phosphorus silica glass (PSG), or borophosphosilicate glass (BPSG). Alternatively, the interlayer dielectric layer 205 may include boron-doped or phosphorus-doped spin-on-glass (SOG), phosphorus-doped tetraethyl orthosilicate (PTEOS), or boron-doped tetraethyl orthosilicate (BTEOS). It should be noted that, before forming the interlayer dielectric layer 205, a contact hole etch stop layer is formed. Co-deposition may be used to achieve good step-coverage for the contact hole etch stop layer. Preferably the contact hole etch stop layer includes silicon nitride.

Figure 2D:
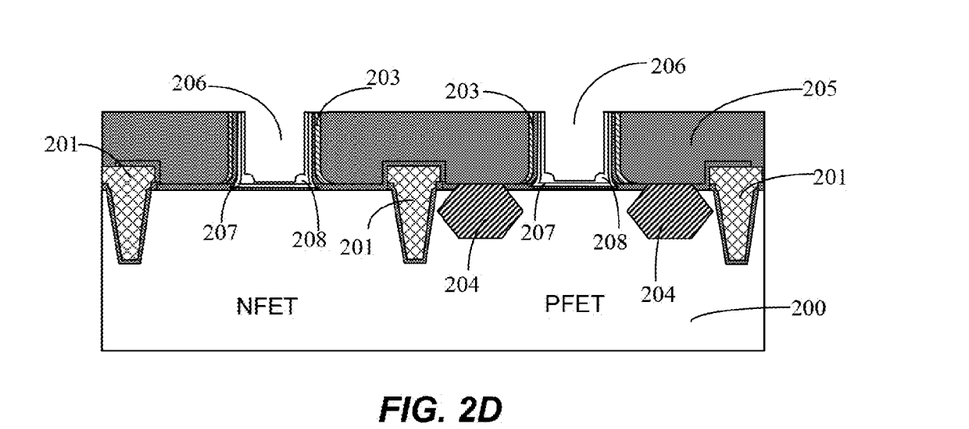

Referring to FIG. 2D, the dummy gate structures 202 are removed to form gate trenches 206. According to an embodiment, the sacrificial gate layer and the sacrificial gate dielectric layer are sequentially removed using dry etching. The parameters for the dry etching are the following: the flow rate of the etching gas HBr is 20-500 sccm; the pressure is 2-40 mTorr; and the power is 100-2000 W. After the dry etching, wet etching is used to remove the residues and impurities left behind by the dry etching.

Still referring to FIG. 2D, an interface layer (IL) is formed at the bottom of each gate trench 206. A high-k (HK) layer 207 is formed on the IL. The IL may include silicon oxide ($SiO_x$). The purpose of the IL is to improve the interfacial characteristics between the HK layer 207 and the semiconductor substrate 200. The IL may be a thermal oxide layer, a nitrogen oxide layer, a chemical oxide film layer, or other suitable thin film layer. The IL may be formed by thermal oxidation, CVD, ALD, PVD, or other suitable processes. The thickness of the IL ranges from about 5 angstroms to about 10 angstroms.

The k value of the HK layer is usually 3.9 or higher. The HK layer may include hafnium oxide, hafnium silicon oxide, hafnium silicon oxynitride, lanthanum oxide, zirconium oxide, zirconium silicon oxide, titanium oxide, tantalum oxide, barium strontium titanium oxide, barium titanium oxide, strontium titanium oxide, aluminum oxide, and the like, preferably titanium oxide, zirconium oxide, or aluminum oxide. The HK layer may be formed by using CVD, ALD, PVD, or other suitable processes. The thickness of the HK layer is normally between 10 angstroms and 30 angstroms.

With reference to FIG. 2D, a cover layer 208 is formed on the high-k dielectric layer 207. The thickness of the cover layer 208 at the corners of the bottom of the gate trench 206 is greater than that in the middle region of the bottom of the gate trench 206.

In one example, the method of forming the cover layer 208 includes: forming a cover layer on the high-k dielectric layer; performing magnetron sputtering on the cover layer to cause the thickness of the cover layer at the corners of the bottom of the gate trench to be greater than that in the middle region of the bottom of the gate trench.

The cover layer 208 may include $La_2O_3$, $Al_2O_3$, $Ga_2O_3$, $In_2O_3$, MoO, Pt, Ru, TaCNO, Ir, TaC, MoN, WN, $Ti_xN_{1-x}$, or other suitable film layer. Suitable process may include CVD, ALD or PVD, preferably ALD. In an embodiment, the cover layer 208 includes TiN. The thickness of the initial cover layer 208 ranges from about 5 angstroms to about 50 angstroms. The thickness of the above-described numerical ranges are merely exemplary. It can be adjusted according to the actual process. It may be appropriate to increase the thickness of the initial cover layer 208, so that after the magnetron sputtering the cover layer retains certain thickness in the middle region of the bottom of the gate trench 206. According to some embodiments, the thickness of the cover layer 208 in the middle region of the bottom of the gate trench 206 after the magnetron sputtering ranges from about 5 angstroms to about 30 angstroms.

According to various embodiments, the magnetron sputtering may be performed using a soft argon gas as a sputtering gas. For example, for a TiN cover layer 208, one may mount the semiconductor substrate on a sputtering target table, evacuate the chamber, and flow in Ar gas. The flow rate may be about 20-40 $cm^3$/min or so, for example 25 $cm^3$/min, 30 $cm^3$/min, or 35 $cm^3$/min. The chamber pressure may be about 0.5-1.5 pa. After glow discharge, sputtering of the cover layer 208 is performed. The part of the cover layer 208 in the middle region of the bottom of the gate trench 206 is removed by the argon bombardment, therefore causing the thinning of the cover layer 208 in the middle region of the bottom of gate trench 206. Some of the removed cover layer material may accumulate at the corners of the bottom of the gate trench 206, thus making the cover layer 208 thicker at the corners of the bottom of the gate trench 206 than in the middle region of the bottom of the gate trench 206. According to embodiments, the difference between the thickness of the cover layer 208 at the corners of the bottom of the gate trench 206 and the that in the middle region of the bottom of the gate trench 206 is about 3 to 30 angstroms, e.g., 3 Å, 5 Å, 10 Å, 15 Å, 20 Å, 25 Å, 30 Å, etc. The above-mentioned numerical ranges are merely exemplary, can also be adjusted according to the actual process.

Figure 2E:
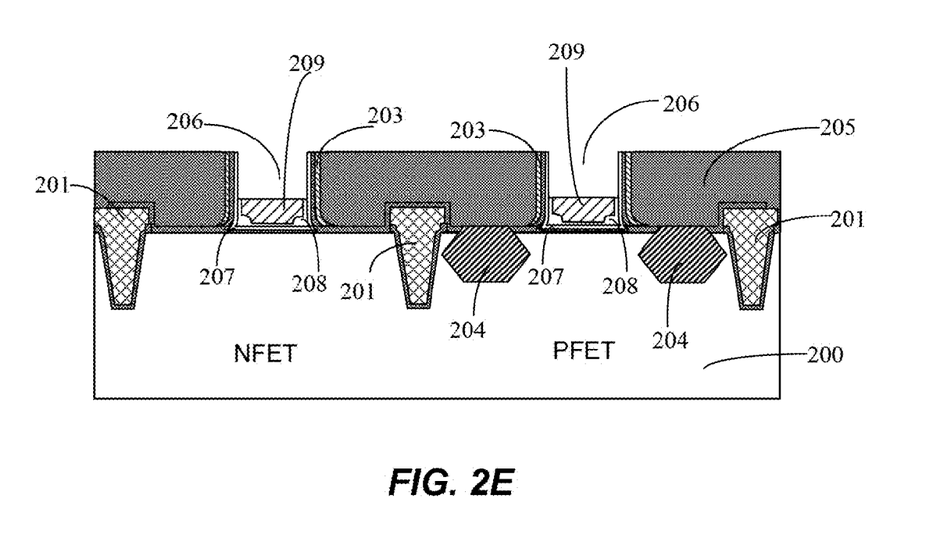

With reference to FIG. 2E, a sacrificial material layer 209 is formed on the cover layer 208 at the bottom of the gate trenches 206. The sacrificial material layer 209 may be a deep ultraviolet light absorbing oxide (DUV Light Absorbing Oxide, referred to as DUO), amorphous carbon, or the like. Preferably, the sacrificial material layer 209 is a relatively thin DUO layer. The DUO layer 209 can generally use a silicone polymer (siloxane polymer) and other polymer materials for the following functions: anti-reflective property in the light exposure process for providing a high etch selectivity to ensure critical dimension; providing a flat surface to ensure a uniform anti-reflective property, while protecting the cover layer 208. In one example, the formation of the thin DUO layer 209 may include: forming a deep ultraviolet light absorbing oxide layer in the gate trench 206; and back etching the deep ultraviolet light absorbing oxide layer to form the relatively thin DUO layer 209 on the cover layer 208 at the bottom of the gate trench 206.

The thickness of the DUO layer 209 depends on the thickness of the cover layer 208 formed on the bottom of the gate trenches. The thickness of the DUO layer 209 may be in the range of 3~10 nm, for example 3 nm, 4 nm, 5 nm, 6 nm, 7 nm, 8 nm, 9 nm, 10 nm and the like. Preferably, the thickness of the DUO layer 209 is about 5 nm.

Still referring to FIG. 2E, back etching is performed to remove the cover layer 208 located on the sidewalls of the gate trench 206, to increase the width of the gate trench 206. The back etching has a high etch selectivity of the cover layer 208 over the high-k dielectric layer 207. The back etching may be performed by a dry etching process. The dry etching process may include, but are not limited to: reactive ion etching (ME), ion beam etching, plasma etching, or laser cutting. The dry etching source gas may include $Cl_2$, $BCl_3$, Ar, $N_2$, $CHF_3$, $CH_4$ and $C_2H_4$ and the like. As an example, in an embodiment, the back-etching is dry etching, and the dry etching parameters are: an etching gas containing $Cl_2$, $BCl_3$ and $CH_4$, at the flow rates of 50 sccm-500 sccm, 10 sccm-100 sccm, and 2 sccm-20 sccm, respectively, and at the pressure of 2 mTorr-50 mTorr, where sccm representatives cubic centimeter per minute, mTorr representatives mmHg. The back etching process can also be any wet etching process having a high etch selectivity of the cover layer 208 over the high-k dielectric layer 207.

The purpose of removing the cover layer 208 located on the sidewalls of gate trench 206 by back etching is to increase the width of the gate trenches 206, thereby reducing the depth-to-width aspect ratio, which will be beneficial to the subsequent filling of metal gate material.

After the back etching of the cover layer 208, the sacrificial material layer 209 may be removed for the subsequent processes. Removing the sacrificial material layer 209 may be performed by any method known to those skilled in the art.

Thereafter, the following steps may be performed: sequentially forming a barrier layer and a work function metal layer on the cover layer 208 and the high-k dielectric layer 207 at the bottom of the gate trench 206; and filling the gate trench 206 over the work function metal layer to form the metal gate.

The barrier layer material can be TaN, Ta, TaAl, or other suitable thin film layer. The barrier layer may be formed by CVD, ALD, or PVD. The thickness of the barrier layer may range from 5 angstroms to 40 angstroms.

A p-type work function metal layer is formed on the barrier layer in the PMOS region. The p-type work function metal layer is an adjustable PMOS work function metal layer. The material for the p-type work function metal layer (PWF) can be selected from, but not limited to, $Ti_xN_{1-x}$, TaC, MoN, TaN, or other suitable thin film layers. The p-type work function metal layer may be formed by CVD, ALD, or PVD. The thickness of the p-type work function metal layer ranges from 10 angstroms to 580 angstroms.

An n-type work function metal layer is formed on the barrier layer in the NMOS region. The n-type work function metal layer is an adjustable NMOS work function metal layer. The material for the p-type work function metal layer (PWF) can be selected from, but not limited to, TaC, Ti, Al, $Ti_xAl_{1-x}$ thin film or other suitable thin film layers. The n-type work function metal layer may be formed by CVD, ALD, or PVD. The thickness of the n-type work function metal layer ranges from 10 angstroms to 80 angstroms.

Finally, metal gate electrode is formed by filling the gate trench over the work function metal layer. Metal gate material may be selected from, but not limited to, Al, W, or other suitable thin film layer. CVD, ALD, PVD, or other suitable processes may be employed to form a metal gate. This completes the main processes of forming metal gates.

Because the work function metal layer formed by PVD (for example, the n-type work function metal layer TiAl) has a strong tensile stress, the work function metal layer is easily deformed into a "bow" shape in the subsequent deposition process or heat treatment, so that the work function metal gate layer is thicker in the middle region of the bottom of the gate trench than at the corners of the bottom of the gate trench. As a result, the aluminum in the metal gate defuses more easily down into the substrate through the corners of the bottom of the gate trench, which reduces the overall reliability and performance of the device. According to the manufacturing method of the present invention, an appropriate increase in the thickness of the cover layer at the corners of the trench bottom effectively inhibits the diffusion of aluminum in those regions. Also, removing the cover layer on the sidewalls of gate trench enhances metal gate material filling capacity, thus improving the reliability and performance of the device.

Figure 3:
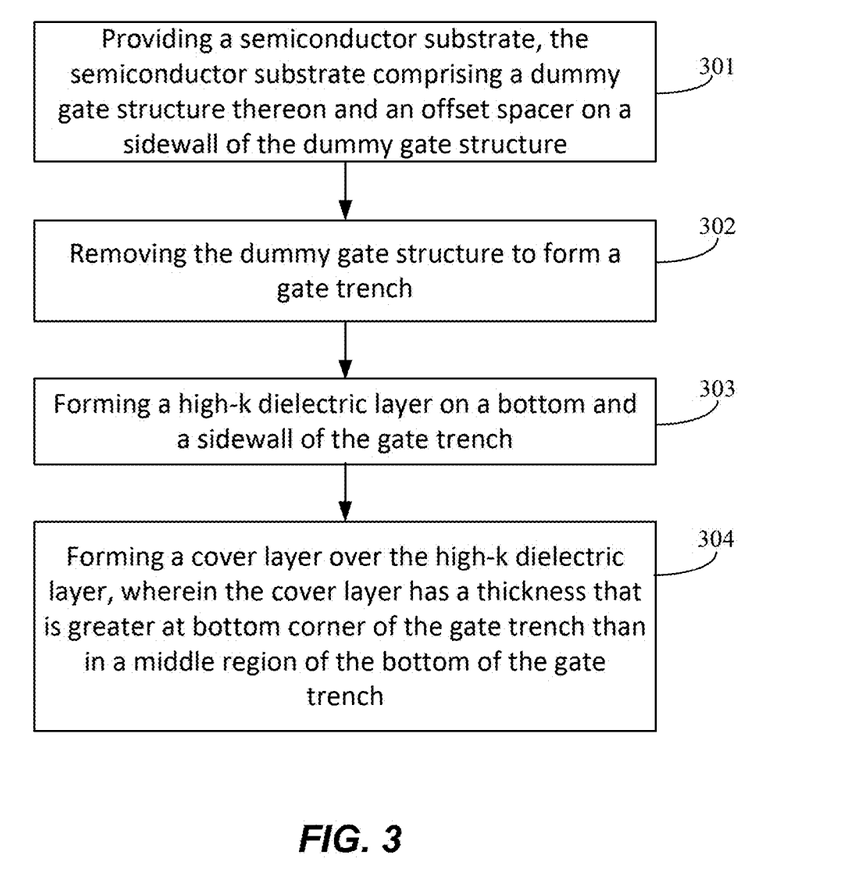
FIG. 3 illustrates a flowchart of a manufacturing method according to an embodiment of the invention.

FIG. 3 shows a schematic flowchart illustrating the steps of a manufacturing process according to an embodiment.

In step 301, a semiconductor substrate is provided. Dummy gate structures are formed on the semiconductor substrate. Offset spacers are formed on the sidewalls of the dummy gate structures.

In step 302, the dummy gate structures are removed to form gate trenches.

In step 303, a high-k dielectric layer if formed at the bottom and sidewalls of the gate trenches by deposition.

In step 304, a cover layer is formed on the high-k dielectric layer. The thickness of the cover layer is greater at the corners of the bottom of the gate trench than that in the middle region of the bottom of the gate trench.

Second Embodiment

A semiconductor device manufactured by a method is provided according to an embodiment.

Figure 4:
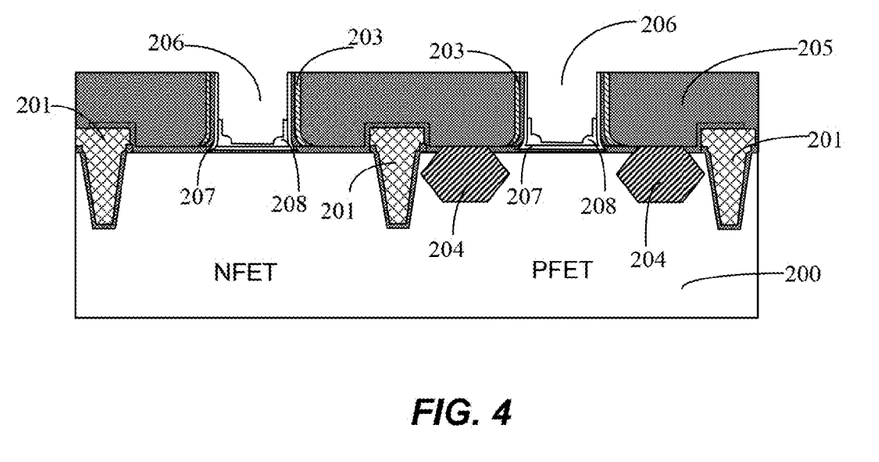
FIG. 4 illustrates a cross-sectional view of a device according to another embodiment of the invention.

With reference to FIG. 4, the semiconductor device includes a semiconductor substrate 200. The semiconductor substrate 200 may include material such as undoped single-crystalline silicon, doped single-crystalline silicon, silicon on insulator (SOI), stacked silicon-on-insulator (SSOI), stacked silicon germanium-on-insulator (S-SiGeOI), silicon germanium-on-insulator (SiGeOI) and germanium-on-insulator (GeOI), and the like. As an example, the semiconductor substrate 200 includes single-crystalline silicon.

The semiconductor device further includes isolation structures 201 formed in the semiconductor substrate 200. The isolation structures 201 may be shallow trench isolation (STI) structures or LOCal Oxidation of Silicon (LOCOS) isolation structures. In an embodiment, the isolation structures are shallow trench isolation structures. Isolation structures 201 divide the semiconductor substrate 200 into NFET areas and PFET areas. A variety of well structures are also formed on the semiconductor substrate 200. The well structures are not shown in FIG. 4 for simplicity.

The semiconductor device further includes an interlayer dielectric layer 205 formed on the semiconductor substrate 200. The interlayer dielectric layer 205 may be a silicon oxide layer, including doped or undoped silicon oxide layer formed by thermal chemical vapor deposition (thermal CVD) or high density plasma (HDP), e.g., undoped silicon glass (USG), phosphosilicate glass (PSG), or borophosphosilicate glass (BPSG). Alternatively, the interlayer dielectric layer 205 may be boron doped or phosphorus doped spin coating glass (spin-on-glass, referred to as SOG), p-doped tetraethoxysilane (PTEOS) or doped boron tetraethoxysilane (BTEOS).

The semiconductor device further includes gate trenches 206 formed in the interlayer dielectric layer 205, offset spacers 203 on the sidewalls of the gate trenches 206 abutting the interlayer dielectric layer 205, and the source/drain region stress layer 204 in the semiconductor substrate 200 on both sides of the gate trench 206. The offset spacers 203 may include material such as silicon nitride, silicon oxide or silicon oxynitride insulating material. In an embodiment, the offset spacers 203 include stacked oxides and nitrides. In CMOS transistors, typically tensile stress layer is formed in a NMOS transistor, and compressive stress layer is formed in a PMOS transistor. The tensile stress acting on the NMOS transistors and the compressive stress acting on the PMOS transistors improve the performance of the CMOS transistors. Usually the tensile stress layer in a NMOS transistor includes SiC, and the compressive stress layer in a PMOS transistor includes SiGe.

The semiconductor device further includes an interface layer (IL) on the bottom of the gate trench 206, and a high-k dielectric layer 207 over the interface layer and on the sidewalls of the gate trench 206. The interface layer may include silicon oxide ($SiO_x$). The purpose of the interface layer is to improve the interface characteristics between the high-k dielectric layer 207 and the semiconductor substrate 200. The IL may be a thermal oxide layer, an oxide layer, a nitrogen oxide layer, a chemical oxide film layer, or other types thin film layers. The IL may be formed by using thermal oxidation, CVD, ALD, PVD, or other thin film processes. The thickness of the IL ranges from about 5 angstroms to about 10 angstroms.

The high-k dielectric layer 207 usually has a k value (dielectric constant) greater than or equal to 3.9, and its constituent material may include hafnium oxide, hafnium silicon oxide, hafnium silicon oxynitride, lanthanum oxide, zirconium oxide, zirconium silicon oxide, titanium oxide, tantalum, barium strontium titanium oxide, barium titanium oxide, strontium titanium oxide, alumina and the like, preferably hafnium oxide, zirconium oxide or aluminum oxide. CVD, ALD, PVD, and other suitable processes may be employed to form the high K dielectric layer 207. High-k dielectric layer 207 may have a thickness ranging from 10 angstroms to 30 angstroms.

The semiconductor device further includes a cover layer 208 over the high-k dielectric layer 207 on the bottom of the gate trenches 206. The cover layer 208 is thicker at the corners of the bottom of the gate trench 206 than in the middle region of the bottom of the gate trench 206. In one example, the difference between the thickness of the cover layer 208 at the corners of the bottom of the gate trench 206 and that in the middle region of the bottom of the gate trench 206 ranges from 3 to 30 Å, e.g., 3 Å, 5 Å, 10 Å, 15 Å, 20 Å, 25 Å, 30 Å, and the like. The thickness of the cover layer 208 in the middle region of the bottom of the gate trench 206 ranges from about 5 angstroms to 20 angstroms. The cover layer 208 may include $La_2O_3$, $Al_2O_3$, $Ga_2O_3$, $In_2O_3$, MoO, Pt, Ru, TaCNO, Ir, TaC, MoN, WN, $Ti_xN_{1-x}$, or other suitable film layer. Preferably, in this embodiment the cover layer 208 includes TiN.

The semiconductor device further includes a barrier layer and a work function metal layer sequentially formed on the high-k dielectric layer and the covering layer. The barrier layer material can be selected from TaN, Ta, TaAl, or other suitable thin film layer. CVD, ALD, PVD, or other suitable processes may be employed to form the barrier layer. The barrier layer thickness ranges from 5 Å to 40 Å.

In the PMOS region, a p-type work function metal layer is formed on the barrier layer. The p-type work function metal layer includes a PMOS adjustable work function metal layer. The p-type work function metal layer (PWF) material may be selected from, but not limited to $Ti_xN_{1-x}$, TaC, MoN, TaN, or other suitable thin film layers. CVD, ALD, PVD, or other suitable processes may be employed to form the p-type work function metal layer. The thickness of the p-type work function metal layer ranges from 10 angstroms to 580 angstroms.

In the NMOS region, an n-type work function metal layer is formed on the barrier layer. The n-type work function metal layer (NWF) includes an NMOS adjustable work function metal layer. The NWF material may be selected from, but not limited to, TaC, Ti, Al, $TixAl_{1-x}$ thin film or other suitable layers. CVD, ALD, PVD, or other suitable processes may be employed to form the n-type work function metal layer. The thickness of the n-type work function metal layer ranges from 10 angstroms to 80 angstroms.

The semiconductor device further includes metal gate electrode formed on the work function metal layer. The metal gate material may be selected from, but not limited to, Al, W, or other suitable thin film layer.

In summary, the semiconductor device according to an embodiment of the present invention includes a cover layer that is relatively thick at the corners of the bottom of the gate trench, which inhibits the diffusion of aluminum in the metal gate electrode, thereby achieving a higher reliability and performance in the semiconductor device.

Third Embodiment

Embodiments of the present invention provide an electronic apparatus. The electronic apparatus includes a semiconductor device and an electronic assembly coupled to the semiconductor device. The semiconductor device is a semiconductor device described in the second example, or a semiconductor device manufactured using the method described in the first example. The electronic assembly may include discrete devices, integrated circuits, or other electronic components.

Illustratively, the electronic apparatus includes a semiconductor device and an electronic assembly coupled to the semiconductor device. The semiconductor device includes: a semiconductor substrate; an interlayer dielectric layer formed on the semiconductor substrate; a gate trench formed in the interlayer dielectric layer; offset spacers formed on the sidewalls of the gate trench abutting the interlayer dielectric layer; stress layers in the source/drain regions on the both sides of the gate trench in the semiconductor substrate; a high-k dielectric layer on the bottom and sidewalls of the gate trench; and a cover layer over the high-k dielectric layer, wherein the cover layer is thicker at the corners of the bottom of the gate trench than in the middle region of the bottom of the gate trench.

Because the semiconductor device has a higher performance and reliability, the electronic apparatus also has the advantages described above.

The electronic apparatus may be a mobile phone, tablet PCs, laptops, netbooks, game consoles, TV receiver, VCD player, DVD player, GPS, camera, video camera, voice recorder, MP3, MP4, PSP players, or any other electronic products or equipment. It can also be an intermediate product having the above semiconductor device, for example: a mobile phone motherboard and the like.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method of forming a semiconductor device, the method comprising:
   providing a semiconductor substrate, the semiconductor substrate comprising a dummy gate structure thereon and an offset spacer on a sidewall of the dummy gate structure;
   removing the dummy gate structure to form a gate trench;
   forming a high-k dielectric layer on a bottom and a sidewall of the gate trench;
   forming a cover layer over the high-k dielectric layer; and
   sputtering the cover layer by magnetron sputtering to cause the cover layer to have a thickness that is greater at corners of the bottom of the gate trench than in a middle region of the bottom of the gate trench.

2. The method of claim 1, wherein the thickness of the cover layer is greater at the corners of the bottom of the gate trench than in the middle region of the bottom of the gate trench by about 3 angstroms to about 30 angstroms.

3. The method of claim 1, wherein the magnetron sputtering uses soft argon gas as a sputtering gas.

4. The method of claim 1, wherein the cover layer is formed by atomic layer deposition (ALD), and comprises TiN.

5. The method of claim 1, further comprising removing a portion of the cover layer that is on the sidewall of the gate trench by back etching.

6. The method of claim 5, further comprising, before removing the portion of the cover layer that is on the sidewall of the gate trench, forming a sacrificial material layer over a portion of the cover layer that is on the bottom of the gate trench.

7. The method of claim 6, wherein the sacrificial material layer comprises a deep ultraviolet light absorbing oxide (DUO) layer.

8. The method of claim 7, wherein the DUO layer is formed by:
  forming the DUO layer; and
  back etching the DUO layer.

9. The method of claim 7, wherein the DUO layer has a thickness ranging from about 3 nm to about 10 nm.

10. The method of claim 1, further comprising, before removing the dummy gate structure:
  forming a source region and a drain region on each side of the dummy gate structure, respectively, in the semiconductor substrate by lightly doped ion implantation;
  forming a pocket area in each of the source region and the drain region by pocket implantation (PKT);
  forming a stress layer in each of the source region and the drain region;
  forming an interlayer dielectric layer on the semiconductor substrate covering the dummy gate structure and the offset spacer; and
  performing chemical mechanical polishing (CMP) on the interlayer dielectric layer to expose a top portion of the dummy gate structure.

11. The method of claim 1, further comprising, after forming the cover layer:
  forming a barrier layer on the cover layer;
  forming a work function metal layer on the barrier layer; and
  forming a metal gate electrode by filling the gate trench.

12. The method of claim 1, further comprising, before forming the high-k dielectric layer, forming an interface layer (IL) at the bottom of the gate trench.

13. A semiconductor device comprising:
  a semiconductor substrate;
  an interlayer dielectric layer formed on the semiconductor substrate;
  a gate trench formed in the interlayer dielectric layer;
  an offset spacer formed on an outer sidewall of the gate trench abutting the interlayer dielectric layer;
  a drain region and a source region on either side of the gate trench, respectively, in the substrate, wherein each of the drain region and the source region comprises a stress layer;
  a high-k dielectric layer formed on a bottom and an inner sidewall of the gate trench; and
  a cover layer formed on the high-k dielectric layer, wherein the cover layer has a thickness that is greater at corners of the bottom of the gate trench than in a middle region of the bottom of the gate trench and a height that is lower than a height of the high-k dielectric layer on the inner sidewall of the gate trench.

14. The semiconductor device of claim 13, further comprising:
  a barrier layer formed on the cover layer; and
  a work function metal layer formed on the barrier layer; and
  a metal gate electrode formed on the work function metal layer filling the gate trench.

15. The semiconductor device of claim 13, wherein the thickness of the cover layer is greater at the corners of the bottom of the gate trench than in the middle region of the bottom of the gate trench by about 3 angstroms to about 30 angstroms.

16. The semiconductor device of claim 13, wherein the cover layer comprises TiN.

17. The semiconductor device of claim 14, wherein the metal gate electrode comprises Al.

18. An electronic apparatus comprising:
  a semiconductor device and an electronic assembly coupled to the semiconductor device, wherein the semiconductor device comprising:
  a semiconductor substrate;
  an interlayer dielectric layer formed on the semiconductor substrate;
  a gate trench formed in the interlayer dielectric layer;
  an offset spacer formed on an outer sidewall of the gate trench abutting the interlayer dielectric layer;
  a drain region and a source region on either side of the gate trench, respectively, in the substrate, wherein each of the drain region and the source region comprises a stress layer;
  a high-k dielectric layer formed on a bottom and an inner sidewall of the gate trench; and
  a cover layer formed on the high-k dielectric layer, wherein the cover layer has a thickness that is greater at corners of the bottom of the gate trench than in a middle region of the bottom of the gate trench and a height that is lower than a height of the high-k dielectric layer on the inner sidewall of the gate trench.

* * * * *